United States Patent
Beer et al.

(10) Patent No.: US 7,759,805 B2
(45) Date of Patent: Jul. 20, 2010

(54) SEMICONDUCTOR DEVICE ENCAPSULATED BY AN ELECTRICALLY CONDUCTIVE PLASTIC HOUSING COMPOSITION WITH CONDUCTIVE PARTICLES

(75) Inventors: Gottfried Beer, Nittendorf (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 304 days.

(21) Appl. No.: 11/834,402

(22) Filed: Aug. 6, 2007

(65) Prior Publication Data
US 2008/0142932 A1    Jun. 19, 2008

Related U.S. Application Data

(63) Continuation-in-part of application No. 11/526,102, filed on Sep. 25, 2006.

(30) Foreign Application Priority Data

Sep. 23, 2005   (DE)   ........................ 10 2005 045 767

(51) Int. Cl.
*H01L 23/48* (2006.01)
*H01L 21/00* (2006.01)
(52) U.S. Cl. ........................ 257/786; 257/789; 257/795; 438/126; 438/127
(58) Field of Classification Search ........................ None
See application file for complete search history.

(56) References Cited

U.S. PATENT DOCUMENTS

| | | | |
|---|---|---|---|
| 4,265,755 A | 5/1981 | Zimmerman | |
| 4,705,762 A | 11/1987 | Ota et al. | |
| 5,011,872 A | 4/1991 | Latham et al. | |
| 5,681,883 A | 10/1997 | Hill et al. | |
| 6,278,192 B1 | 8/2001 | Takigawa et al. | |
| 6,284,959 B1 | 9/2001 | Nicolosi | |
| 6,372,351 B1 | 4/2002 | Takemiya et al. | |
| 6,555,906 B2 * | 4/2003 | Towle et al. | 257/723 |
| 6,701,614 B2 * | 3/2004 | Ding et al. | 29/848 |
| 6,838,776 B2 * | 1/2005 | Leal et al. | 257/783 |
| 7,361,987 B2 * | 4/2008 | Leal et al. | 257/723 |
| 2003/0002271 A1 | 1/2003 | Nurminen | |
| 2003/0151030 A1 | 8/2003 | Gurin | |
| 2003/0155639 A1 | 8/2003 | Nakamura et al. | |
| 2003/0183418 A1 | 10/2003 | Castro et al. | |
| 2004/0217472 A1 | 11/2004 | Aisenbrey et al. | |
| 2005/0016714 A1 | 1/2005 | Chung | |
| 2005/0222323 A1 | 10/2005 | Zhou et al. | |
| 2006/0040112 A1 | 2/2006 | Dean et al. | |
| 2008/0142960 A1 * | 6/2008 | Leal et al. | 257/723 |

\* cited by examiner

*Primary Examiner*—Alonzo Chambliss
(74) *Attorney, Agent, or Firm*—Edell, Shapiro & Finnan, LLC

(57) ABSTRACT

A semiconductor device with a plastic housing composition includes a semiconductor chip and an internal wiring. The plastic housing composition is electrically conductive and electrically connected to a first contact pad of the internal wiring. A first side of the semiconductor chip is electrically insulated from the plastic housing composition by an insulation layer.

19 Claims, 6 Drawing Sheets

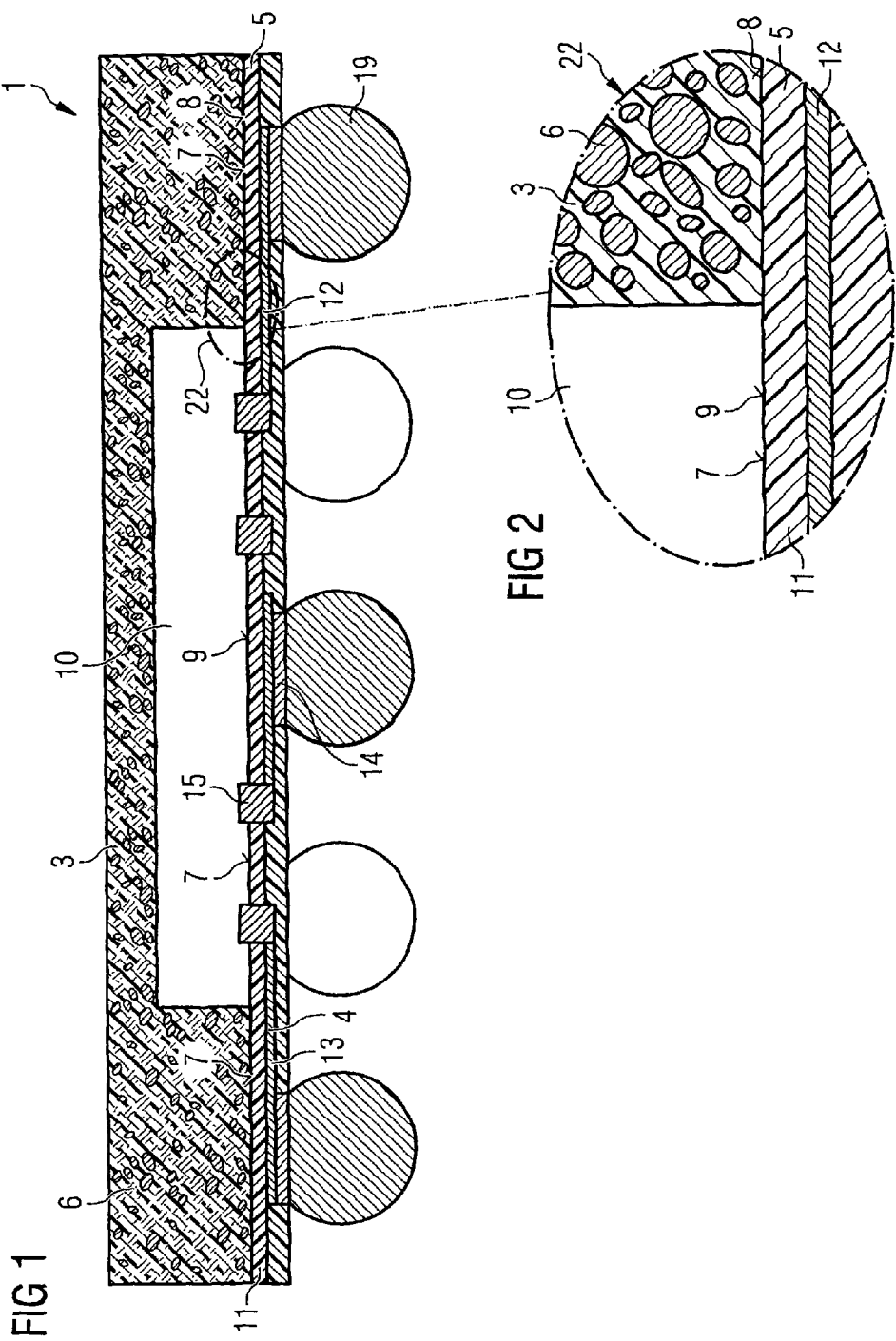

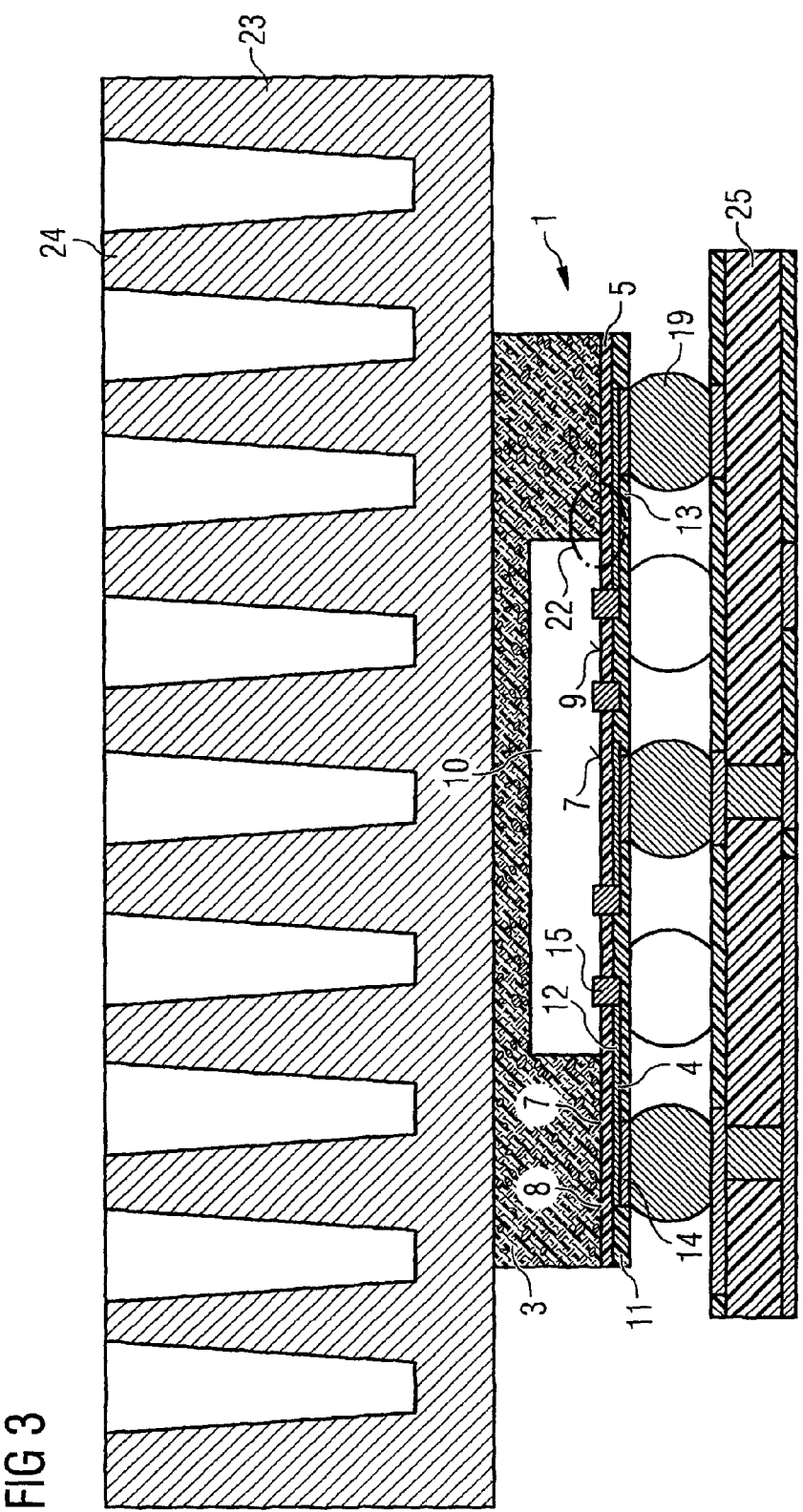

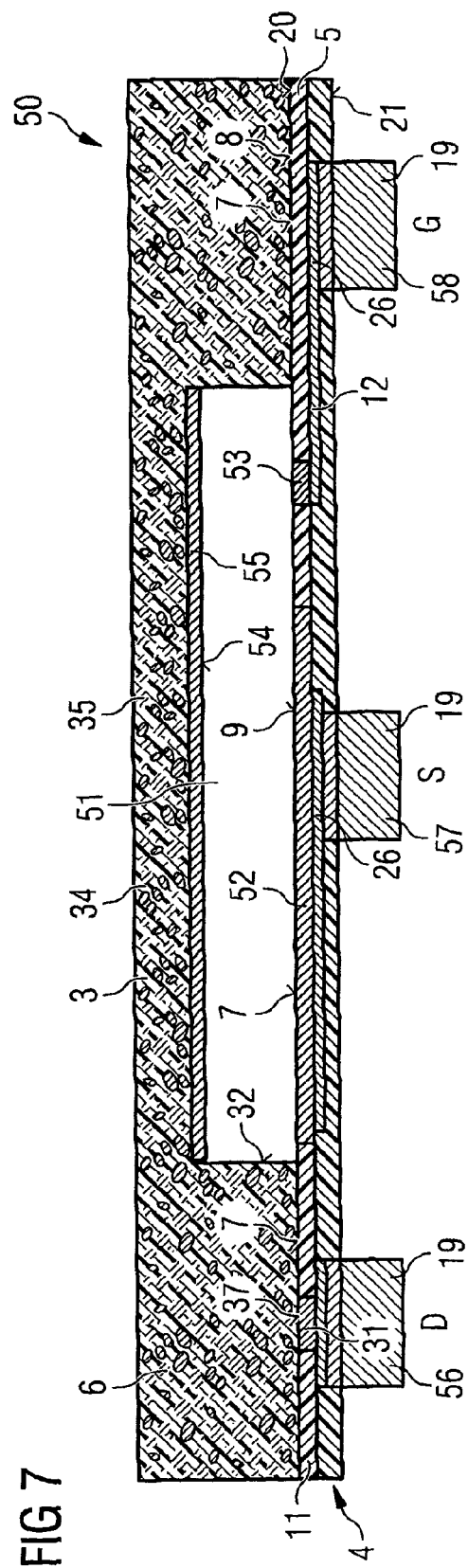

SEMICONDUCTOR DEVICE ENCAPSULATED BY AN ELECTRICALLY CONDUCTIVE PLASTIC HOUSING COMPOSITION WITH CONDUCTIVE PARTICLES

CROSS REFERENCE TO RELATED APPLICATIONS

This application is a continuation-in-part of U.S. patent application Ser. No. 11/526,102, filed on Sep. 25, 2006, entitled "Semiconductor Device with Plastic Housing Composition and Method for Producing the Same," which claims priority under 35 U.S.C. §119 to Application No. DE 102005045767.3 filed on Sep. 23, 2005, entitled "Semiconductor Device with Plastic Housing Composition and Method for Producing the Same," the entire contents of which are hereby incorporated by reference.

BACKGROUND

Semiconductor devices with plastic housing compositions are in widespread use in semiconductor electronics. On the one hand, the plastic housing composition is intended to protect and hold together the electronic components and, on the other hand, in so far as internal wirings are provided within the semiconductor device, they are intended to be electrically insulated from one another by the plastic housing composition. Filler particles are introduced into a plastic housing composition of this type and they are intended to reduce the coefficient of expansion of the plastic housing composition to an extent such that the thermal stresses between the plastic housing composition and semiconductor chips are reduced. Furthermore, the filler particles are intended to increase thermal conductivity.

A known plastic composition has boron nitride as filler particles and, alternatively, also contains silicon carbide and aluminum nitride, in order to improve the thermal conductivity of the plastic housing composition and simultaneously to reduce the coefficient of thermal expansion of the plastic housing composition. Known filler materials contain aluminum nitride, boron nitride or zinc oxide, which having good thermal conductivity, and are intended to electrically insulate the components of the electronic semiconductor device from one another. A known plastic composition for an injection molding method relies on filler particles comprising boron nitride admixed in order to reduce the thermal resistance and at the same time to reduce the coefficient of expansion of the plastic housing composition.

A common limitation to all of the previously described plastic compositions with fillers is that they have ceramic fillers which are limited in terms of their thermal conductivity and also cannot adequately decrease the coefficient of thermal expansion of the plastic housing composition even with a high degree of filler (e.g., 92% by volume).

SUMMARY

Described herein is a semiconductor device (e.g., integrated circuit device) with a plastic housing composition that utilizes novel filler particles that are better suited in terms of their thermal conductivity properties and also in terms of the properties that reduce the coefficient of thermal expansion of the plastic housing composition.

The described semiconductor device is provided with a plastic housing composition, the semiconductor device including an internal wiring that is electrically insulated from the plastic housing composition by an insulation layer. The plastic housing composition comprises electrically semiconducting and/or electrically conducting materials as filler particles. A method for producing the described semiconductor device is likewise described herein.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 1 shows a schematic cross section through a semiconductor device in accordance with a first embodiment.

FIG. 2 shows a schematic enlargement of a partial region of the semiconductor device of FIG. 1.

FIG. 3 shows a schematic cross section through the semiconductor device of FIG. 1 and further including a heat sink.

FIG. 7 illustrates a cross-section cross section through a semiconductor device in accordance with a fifth embodiment.

DETAILED DESCRIPTION

Figure 4:
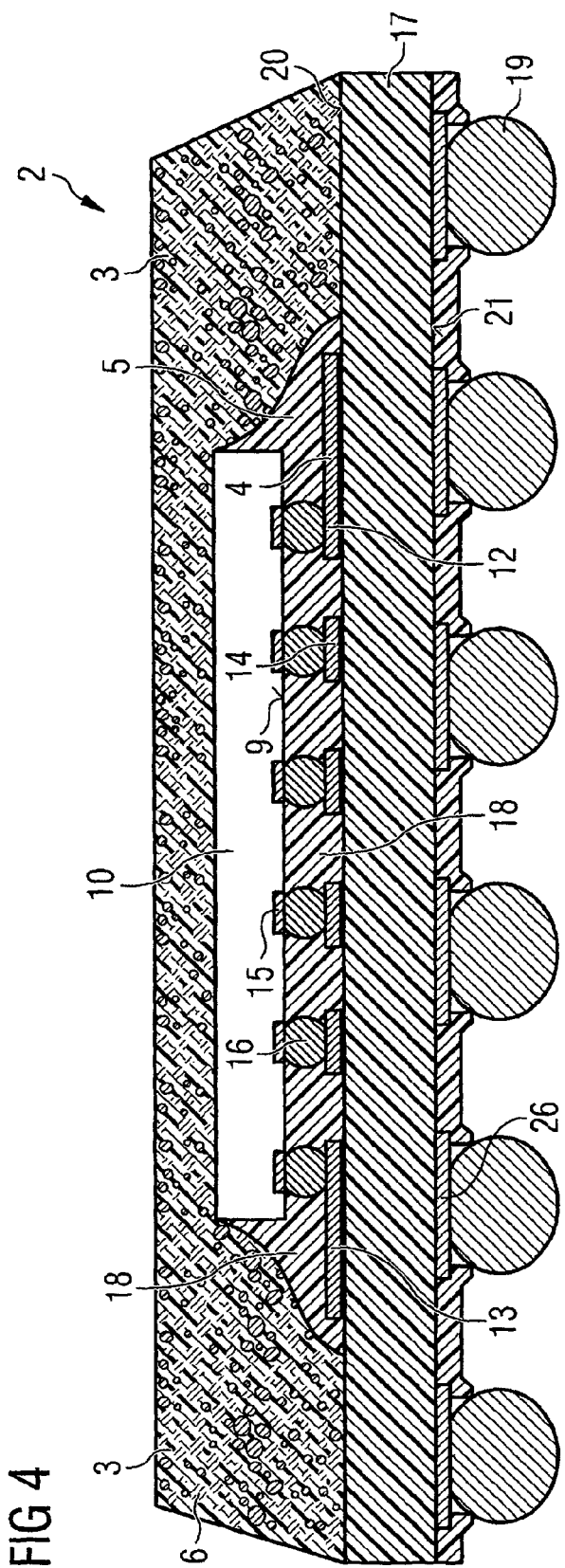
FIG. 4 shows a schematic cross section through a semiconductor device in accordance with a second embodiment.

Described herein is a semiconductor device (e.g., integrated circuit device) provided with a plastic housing composition, where the semiconductor device includes an internal wiring that is electrically insulated from the plastic housing composition by an insulation layer. The plastic housing composition comprises electrically semiconducting and/or electrically conducting materials as filler particles.

The described semiconductor device provides a number of advantages including, without limitation, that the thermal stresses between semiconductor chips and plastic housing composition in a semiconductor device of this type can be reduced further since it is now possible to use filler materials which have not found application heretofore in semiconductor technology (since they are not completely electrically insulating). The internal wiring of the semiconductor device is not jeopardized by the plastic housing composition with electrically semiconducting and/or electrically conducting filler particles since the internal wiring is electrically insulated by a separate insulation layer.

This opens up the possibility of using a wide range of electrically semiconducting and electrically conducting filler particles which not only reduce the coefficient of thermal expansion and thus improve the thermal stresses between semiconductor chip and plastic housing composition, but primarily also significantly increase the thermal conductivity of a plastic housing composition of this type, so that accumulation of heat in conjunction with a high power loss of the semiconductor device does not occur within the plastic housing. Such plastic housing acts like a head spreader. Furthermore, a plastic housing composition of this type opens up the possibility of arranging a further heat sink onto the plastic housing composition, the heat sink taking up the heat loss via the plastic housing composition with electrically semiconducting and/or electrically conducting filler particles and dissipating it to the surroundings.

A third advantage that favors the plastic housing composition with electrically semiconducting and/or electrically conducting filler particles since the filler particles already constitute a shielding effect against electromagnetic interference radiation. This shielding is extremely intensive, moreover, since the plastic housing composition acts with its shielding particles directly on the upper sides of the embedded semiconductor chip.

In an exemplary embodiment, the internal wiring comprises at least one ground pad which is not electrically insulated from the plastic housing composition by the electrically insulating layer. The plastic housing composition is in contact with, and electrically connected to, the at least one ground pad. The ground pad is electrically connected by conductor tracks of the internal wiring to one or more external contacts of the semiconductor device which provide a ground contact. The ground contacts may be electrically connected to a ground plane of a circuit board on which the semiconductor device is mounted. The plastic housing composition is, as a whole, electrically conductive and so provides a grounding path for the rear side and side faces of the semiconductor chip which are in contact with the plastic housing composition.

In another exemplary embodiment, the wiring structure comprises at least one first contact pad which is in contact with the electrically conductive plastic housing composition and the semiconductor chip is a vertical semiconductor device which includes a contact pad on its rear side as well as at least one contact pad on the opposing upper side. The rear side of the semiconductor chip is electrically connected to the first contact pad which is electrically connected by conductor tracks of the internal wiring structure to at least one external contact of the device positioned on the lower surface of the device. In this embodiment, the plastic housing composition provides a portion of the internal rewiring structure which extends between the contact on the rear surface of the semiconductor chip and its corresponding external contact. The semiconductor chip may be a diode or a transistor such as a MOSFET (Metal Oxide Semiconductor Field Effect Transistor), and IGBT (Insulated gate Bipolar 'Transistor) or a BJT (Bipolar Junction Transistor) device.

The contact pad on the rear side of the semiconductor chip may be a drain contact. The source pad and gate pad of the transistor are positioned on the opposing surface and are electrically insulated from the plastic housing composition by the electrically insulating layer, which may be the uppermost layer of a multi-layer rewiring structure.

In one exemplary embodiment, the plastic housing composition comprises silicon particles. Silicon particles inherently behave like the silicon semiconductor chips themselves in terms of their expansion behavior, with the result that an ideal adaptation of the coefficient of thermal expansion may occur here. Moreover, polycrystalline silicon with high doping has a high thermal conductivity, with the result that these particles are particularly suitable for being used as filler particles in the plastic housing composition.

In a further exemplary embodiment, the plastic housing composition is filled with carbon fiber particles. Carbon fiber particles may constitute a certain problem in the injection molding technique. However, thought is given to carbon fiber particles having extremely short sections, so that they assume more or less rod-shaped external contours. Carbon fiber particles of this type, mixed with plastic housing composition, can be processed relatively well, especially as carbon is also a lubricant, as long as the fibers comprise the graphite modification of carbon.

In a further embodiment, the plastic housing composition comprises carbon nanotube particles. Carbon nanotube particles of this type not only exhibit outstanding thermal conductivity properties, but are also suitable for being able to be introduced particularly densely in a plastic housing composition. Due to the high degree of filler that can be achieved with carbon nanotube particles and the extremely good thermal conduction properties of such carbon nanotubes, a plastic housing of this type affords a significant improvement of conventional plastic housing compositions with ceramic particles.

In a further embodiment, the plastic housing composition comprises other nanotube particles (e.g., Si, Zn, or a mixtures of substances). Such nanotube may have single wall and/or a multi wall structure.

In accordance with another exemplary embodiment, a semiconductor device is provided comprising carbon fullerenes as filler particles in the plastic housing composition. The carbon fullerenes can be produced by pulverizing carbon electrodes in electrical discharge flashes. Fullerenes of this type have the advantage that they constitute a spherical network of hexagonally arranged carbon atom rings, the hexagonal ring structures then forming a closed spherical surface in a manner similar to a benzene ring. Such spherical particles have the further advantage that they are particularly well suited to an injection molding process. Compared with fibers and tubes, spherical particles of this type can be introduced into the plastic housing composition with a high degree of filler.

In a further embodiment, the plastic housing composition comprises metal particles. However, not all metal particles having excellent thermal conductivities are suitable for being incorporated into a plastic housing composition, since their coefficient of thermal expansion does not significantly reduce the coefficient of expansion of the plastic housing composition. Only metals having a very high melting point exhibit a minimal coefficient of thermal expansion and thus help to adapt the coefficient of expansion of the plastic housing composition to the coefficient of expansion of the semiconductor chip. Therefore, optionally molybdenum or tungsten particles are mixed into the plastic housing composition as fillers.

Filler particles made of a semiconductor material (e.g., silicon) are particularly suitable for use as filler, moreover, if they have an oxide layer on their upper side as a result of a simple thermal oxidation. It is thus possible to dispense with special insulation of the internal wiring in a semiconductor device. A different configuration is afforded by diamond-coated silicon particles. In particular, carbon is applied to the silicon and converted either into silicon carbide or into diamond particles. The formation of diamond coatings is accommodated by the crystal lattice structure of silicon, which corresponds exactly to the diamond lattice structure.

The plastic housing composition according to the embodiment with a filler made of electrically semiconducting and/or electrically conducting particles is particularly suitable for semiconductor devices having a coplanar area on which the internal wiring is arranged, and/or for semiconductor devices with flip-chip contacts, the flip-chip contacts and the associated internal wiring being embedded in an insulating underfill material. Consequently, the described housing composition improves semiconductor devices having a coplanar area comprising an upper side of the plastic housing composition and the upper side of at least one semiconductor chip.

An insulating intermediate layer that carries a wiring structure comprising conductor tracks and contact pads is arranged on the coplanar area. The contact pads are electrically connected via conductor tracks to contact areas of the semiconductor chip on the coplanar area, so that the plastic housing composition with electrically semiconducting and/or electrically conducting filler particles is in contact neither with the conductor tracks nor with the contact pads nor with the contact areas. This means that semiconductor devices constructed in this way can optionally be equipped with a plastic housing composition according to the described embodiments and thus have an improved thermal conductivity.

Semiconductor devices which include semiconductor chips with flip-chip contacts on the active upper sides of the semiconductor chips include a wiring substrate, on which the semiconductor chips with the flip-chip contacts are arranged. However, the upper side of the wiring substrate with the flip-chip contacts is embedded in an insulating underfill matrix, so that the surrounding plastic housing composition with electrically semiconducting and/or electrically conducting filler particles makes contact neither with the wiring structure of the wiring substrate nor with the flip-chip contacts. With this type of semiconductor device, it is accordingly not necessary to implement any precautionary measure at all to protect the internal wiring from the electrically conducting or semiconducting plastic composition, since this protection is already afforded by the insulating underfill material.

A method for producing a plurality of semiconductor devices with a plastic housing composition including electrically semiconducting and/or electrically conducting filler particles is carried out with the following steps as described below.

The first step involves producing electrically semiconducting and/or electrically conducting filler particles. These filler particles are subsequently mixed with a plastic housing composition. This is followed by packaging of semiconductor chips arranged in rows and columns in semiconductor device positions of a panel into the plastic housing composition with the formation of a coplanar area comprising upper sides of semiconductor chips and upper sides of the plastic housing composition. A patterned insulation layer is subsequently applied selectively to the coplanar area while leaving free contact areas of the semiconductor chips. A wiring structure is then applied selectively to the patterned insulation layer while connecting the contact areas of the semiconductor chip to contact pads of the wiring structure via conductor tracks of the wiring structure. Finally, external contacts are applied to the contact pads and the panel with its semiconductor device positions can subsequently be separated into individual semiconductor devices. It is also possible for the external contacts to be applied to the contact pads only after the separation of the semiconductor device positions into individual semiconductor devices.

If the semiconductor device optionally comprises flip-chip contacts, then the latter are produced by a method that deviates in some steps from the method described above. The first step, however, involves producing electrically semiconducting and/or electrically conducting filler particles, and the latter are mixed with a plastic housing composition. A further production method relates firstly to a semiconductor wafer with semiconductor chip positions and flip-chip contacts in the semiconductor chip positions and also to separation of the semiconductor wafer into individual semiconductor chips with flip-chip contacts. A wiring substrate with a wiring structure and corresponding semiconductor device positions is prepared in parallel with this. This is followed by applying the semiconductor chips by their flip-chip contacts in the semiconductor device positions of the wiring substrate.

Afterward, the plastic housing composition with its electrically conducting particles is not immediately applied, since the flip-chip contacts and also the wiring structure are still unprotected and uncovered. Therefore, firstly the flip-chip contacts and the active upper side of the semiconductor chips and also the wiring structure on the wiring substrate are embedded in an insulating underfill composition which is adapted to the semiconductor chip in terms of its thermal expansion behavior. After the introduction of the underfill material, the plastic housing composition can then be applied to the upper side of the wiring substrate while embedding the semiconductor chip and the underfill material in the plastic housing composition. Finally, external contacts can be applied to the wiring substrate, to be precise to the underside thereof, and the wiring substrate can subsequently be separated into individual semiconductor devices.

This method makes it possible to produce semiconductor devices including, as plastic housing composition, a plastic housing composition with electrically semiconducting and/or electrically conducting filler particles without the risk of the flip-chip contacts being short-circuited by the electrically semiconducting and/or electrically conducting filler particles.

In one exemplary method, a melt of the filler material is atomized for the purpose of producing electrically semiconducting and/or electrically conducting filler particles. During this atomization, virtually spherical, very small filler particles arise and enable a high degree of filler in the plastic housing composition. Instead of atomization, it is also possible to use dropwise application, which produces spherical filler particles with larger dimensions.

In an alternative method, after the atomization or dropwise application, the electrically semiconducting and/or electrically conducting filler particles are passed through an oxidizing gas stream, so that the surfaces oxidize. However, only filler particle materials which do not themselves form volatile oxides are suitable for this purpose. In a similar manner, silicon particles may be provided with a diamond and/or silicon carbide coating in a fluidized bed furnace, by way of example.

Moreover, the filler particles may be provided with such layers in chemical or physical deposition methods. Furthermore, it is also possible for the filler particle material to be ground or even pulverized using traditional methods.

In order to produce carbon fullerenes, carbon electrodes are optionally pulverized in electrical discharge flashes, a high portion of fullerenes being formed.

To summarize, it can be established that for a good thermal conductivity of the plastic housing composition, the fillers should have a correspondingly good thermal conduction. This good thermal conduction in conjunction with the requirement for good electrical insulation and small thermal expansion is provided only in the case of pure diamond and a few ceramic materials. However, there are device forms, such as the "Embedded Dies Packaging Concept", in which electrical insulation of the plastic housing composition can be dispensed with since corresponding insulating layers are provided between the semiconductor chip or the plastic surface and the metallic wiring structures in semiconductor components of this type.

It is also possible to use conductive materials having a correspondingly low coefficient of expansion and a correspondingly high thermal conductivity, as has been shown in the exemplary embodiments above. However, the flow properties of the plastic housing composition greatly depend on the geometrical dimensions of such filler particles. Round bodies with corresponding diameter distributions are advantageous as filler particles, so that volume interstices can be filled by smaller grains. Fiber materials are not always optimally suitable with regard to the injection molding process.

On the other hand, there are silicon particles which can be adapted in terms of distribution and form to the requirements of the plastic housing composition and the requirements of the injection molding process. The silicon particles can be atomized in the liquid phase, so that they are present as spherical particles. If the liquid phase is not atomized in an inert atmosphere, but rather in an oxygen atmosphere or in a water atmosphere, then an oxide skin automatically arises, which has an improved adhesion to the plastic housing composition and simultaneously has an electrically insulating action.

Moreover, it is possible to coat such silicon particles with extremely thin diamond layers, a method for the diamond coating of silicon particles being less expensive and more cost-effective than diamond production itself, whereby at the same time the thermal conductivity of the silicon particles is also improved in conjunction with an increase in the contact resistances between the individual silicon particles. As already envisaged above, metals having a high melting point such as tungsten and molybdenum are also appropriate since they have a very low coefficient of expansion with sufficient thermal conduction. An atomization and/or a coating are possibly feasible.

In an exemplary embodiment, a semiconductor device is produced using the following method. A plastic housing composition is provided which comprises a plastic electrically insulating matrix and electrically conductive filler particles. The electrically conductive and/or semiconductive filler particles are embedded within the plastic electrically insulating matrix and provided in a proportion in such that the plastic housing composition, after curing, as a whole is electrically conductive.

The plastic housing composition may provide an electrically conductive connection to selected pads of the internal wiring and external contacts of the semiconductor device. The semiconductor device may include an internal wiring fabricated by the "embedded dies packaging concept." In the embedded dies packaging concept, the semiconductor chip is first embedded in the plastic housing composition to form a side in which the surface of the plastic housing composition and the chip contact pads are coplanar. A rewiring structure is afterward built up by applying structured dielectric layers and metal layers on this side.

Semiconductor chips arranged in rows and columns for semiconductor device positions of a panel are packaged into the plastic housing composition so that a coplanar area comprising upper sides of the semiconductor chips and upper sides of the plastic housing composition is formed. A patterned insulating layer is selectively applied to the coplanar area while leaving free chip contact areas of the semiconductor chips and at least one region of the plastic housing composition which is adjacent each semiconductor chip in each semiconductor device positions. A wiring structure is applied to the patterned insulation layer, electrically connecting the chip contact areas and the region of the plastic housing composition exposed from the insulation layer, to second contact pads of the wiring structure via conductor tracks of the wiring structure. External contacts are applied to the second contact pads and the semiconductor device positions of the panel are separated to produce individual semiconductor devices.

This method may be used to fabricate a semiconductor device in which the plastic housing composition provides a ground for the rear side of the semiconductor chip. Alternatively, this method may be used to fabricate a semiconductor device in which the semiconductor chip is a vertical semiconductor device such as a transistor. In this case, the plastic housing composition provides a portion of the internal wiring between a contact pad positioned on the rear side of the semiconductor chip, for example the drain, and its corresponding external contact.

In an exemplary embodiment, a semiconductor device is produced using the following method. A plastic housing composition comprising a plastic electrically insulating matrix and electrically conductive and/or semiconductive filler particles is provided. As in the previous embodiment, the plastic housing composition as a whole is electrically conductive. A plurality of semiconductor chips with flip-chip contacts is provided. A wiring substrate with a rewiring structure comprising at least one ground pad at a plurality of device positions of the wiring substrate is provided. A semiconductor chip is applied in each of the device positions of the rewiring substrate such that the flip-chip contacts are in electrical contact with the wiring structure. The flip-chip contacts, active upper sides of the semiconductor chips and the wiring structure are embedded in an electrically insulating underfill material which is positioned between each semiconductor chip and the wiring substrate. The at least one ground pad of the wiring structure is left free from the electrically insulating underfill material. The plastic housing composition is applied to an upper side of the wiring substrate, embedding the semiconductor chips, the underfill material and the at least one ground pad and electrically connecting the plastic housing composition to the at least one ground pad. External contacts are applied to an underside of the wiring substrate and the semiconductor device positions of the rewiring substrate are separated into individual semiconductor devices.

The semiconductor device may include a pre-formed rewiring substrate onto which the semiconductor chip is mounted and onto which the plastic housing composition is applied.

The semiconductor device and method are now described in further detail in relation to exemplary embodiments as depicted in FIGS. 1-7.

FIG. 1 shows a schematic cross section through a semiconductor device 1 of a first embodiment. The semiconductor device 1 was produced according to the "embedded dies packaging concept." In particular, the semiconductor chip 10 is embedded in a plastic housing composition 3 according to the exemplary embodiment such that the active upper side 9 of the semiconductor chip 10 together with the upper side 8 of the plastic housing composition 3 forms a coplanar area 7. Freely accessible contact areas 15 on the active upper side 9 of the semiconductor chip 10 then lie on the coplanar areas 7. An insulation layer 5 is applied to the upper side 8 of the plastic housing composition and to the upper side 9 of the semiconductor chip, that is to say to the coplanar area 7, while leaving free the contact areas 15 of the semiconductor chip 9.

This layer 5 insulates both the upper side 9 of the semiconductor chip 10 and the surface 8 of the plastic housing composition 3 with its electrically semiconducting and/or electrically conducting filler particles 6. A wiring structure 12, including internal wiring 4 with conductor tracks 13 and contact pads 14, is then applied to an insulating and patterned intermediate layer 11 (formed from the insulation layer 5). In a concluding production step, external contacts 19 are arranged on the contact pads 14.

One advantage of a semiconductor device 1 of this type is the high adaptation of the coefficient of expansion of the plastic housing composition 3 by the filler particles 6, which, as explained above, may comprise fullerenes, carbon nanotubes, silicon, tungsten and/or molybdenum. In this case, the individual filler particles 6 optionally have a geometry that is spherical (e.g., a spherical surface) or generally or approximately cylindrical in form or shape. Their surfaces may also be processed with silicon carbide, diamond or other insulating coatings, such as silicon dioxide, to form electrically insulating filler particles 6 prior to introduction into a plastic housing composition 3.

FIG. 2 shows a schematic enlargement of the partial region 22 of FIG. 1. The partial region 22 shows part of the monocrystalline semiconductor chip 10 which is adjoined by an adjacent plastic housing composition 3 with electrically semiconducting and/or electrically conducting filler particles 6. The grain diameter of the filler particles 6 varies in order to achieve a highest possible degree of filler (e.g., up to 92% by volume). An insulating intermediate layer 11 is applied on the coplanar area 7 comprising the upper side 9 of the semiconductor chip 10 and the upper side 8 of the plastic housing composition 3, so that neither the semiconductor material nor the possibly electrically semiconducting and/or electrically conducting plastic housing composition 3 can make contact with the wiring structure 12 arranged on the insulating intermediate layer 11.

FIG. 3 shows a schematic cross section through the semiconductor device 1 of FIG. 1 with a heat sink 23 on the plastic housing composition 3. Since the plastic housing composition 3 has a significantly higher thermal conductivity by comparison with conventional plastic housings, the heat loss of the semiconductor chip can be passed on to the heat sink 23 comprising cooling fins 24 without accumulation of heat in the plastic housing composition 3. Consequently, it is possible to achieve an intensive cooling of the semiconductor device 1 equipped with a plastic housing composition 3 according to the described device. The semiconductor device 1 can be arranged in surface-mounted fashion on a superordinate circuit board 25 and heat loss of the semiconductor chip 10 can be passed on to the surroundings via the circuit board 25, too.

FIG. 4 shows a schematic cross section through a semiconductor device 2 of a second embodiment. Components having functions identical to those in the previous figures are identified by the same reference symbols and are not explained separately. The semiconductor chip 10 does not form a coplanar area with the plastic housing composition 3; rather the semiconductor chip 10 is equipped with flip-chip contacts 16 on its active upper side 9. The flip-chip contacts 16 are electrically connected to the semiconductor chip 10 via contact areas 15. The semiconductor chip 10 is surface-mounted with the flip-chip contacts 15 on a wiring substrate 17, the wiring substrate 17 including a wiring structure 12 with conductor tracks 13 and contact pads 14 as internal wiring 4 on its upper side 20.

The wiring structure 12 and also the flip-chip contacts 16 and the active upper side 9 of the semiconductor chip 10 are embedded in an insulating underfill material 18 for semiconductor devices 2 of this type, so that the plastic housing composition 3 according to the exemplary embodiment with electrically semiconducting and/or electrically conducting filler particles 6 can also be applied. The insulating portion of the upper side 20 of the wiring substrate 17 and also the underfill material 18 and the semiconductor chip 10 are embedded in the plastic housing composition. In order to make contact with the flip-chip contacts externally, external contacts 19 are arranged on corresponding external contact areas 26 on the underside 21 of the wiring substrate 17.

Figure 5:
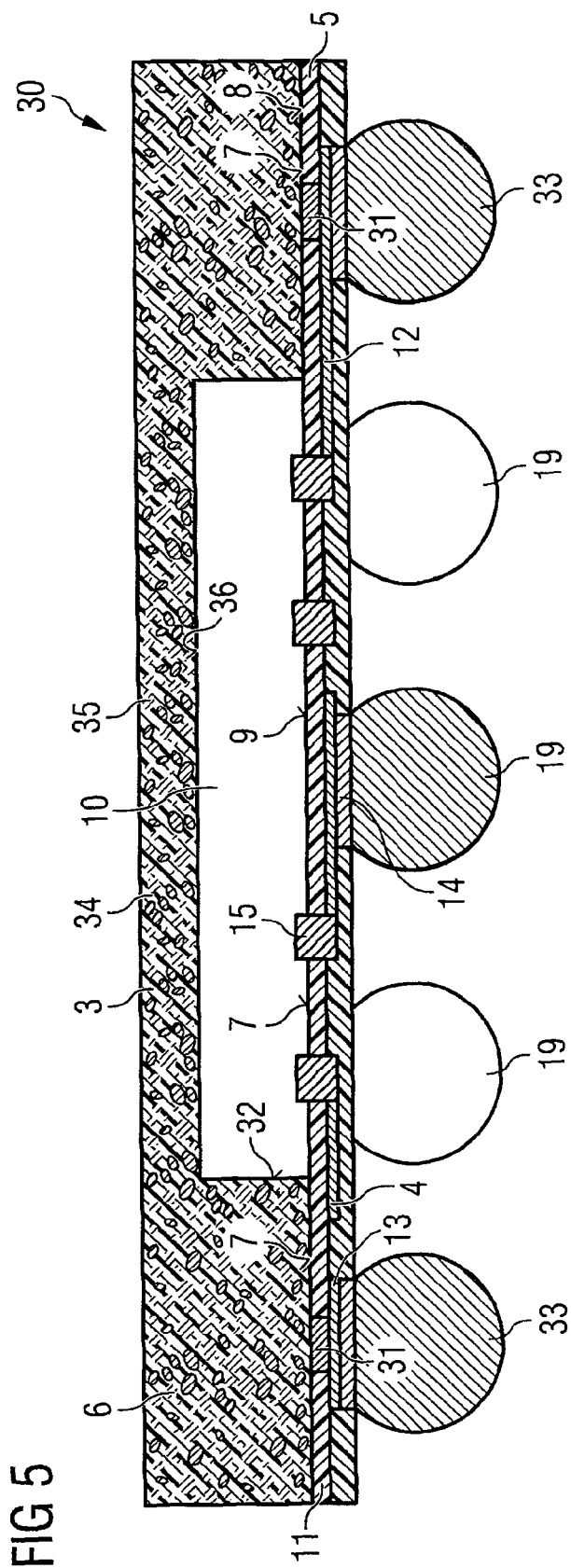
FIG. 5 illustrates a cross-section cross section through a semiconductor device in accordance with a third embodiment.

FIG. 5 illustrates a semiconductor device 30 according to a third embodiment. The semiconductor device 30 of the third embodiment was produced according to the embedded dies packaging concept and includes a basic arrangement similar to that of the first embodiment illustrated in FIGS. 1 to 3. The semiconductor device 30 of the third embodiment is distinguished in that the wiring structure 4 includes a plurality of ground pads 31 which are positioned in the uppermost electrically insulating layer 11 of the wiring structure 4. The ground pads 31 are arranged adjacent side faces 32 of the semiconductor chip 10. Optionally, the ground pads 31 are distributed at intervals adjacent all four sides of the semiconductor chip 10. Each ground pad 31 extends from the coplanar area 7 through the uppermost insulating layer 11 and is electrically connected by conductor tracks 13 to external contacts 33 of the semiconductor device 30. The external contacts 33 of the semiconductor device 30 are optionally positioned at intervals around the periphery of the semiconductor device 30.

The plastic housing composition 3 of the semiconductor 30 comprises an electrically insulating plastic matrix 34 in which a plurality of electrically conductive particles 35 are embedded. The proportion of electrically conductive particles 35 of the plastic housing composition 3 is selected so that the plastic housing composition 3 as a whole is electrically conductive. The plastic housing composition 3 is electrically connected to the ground pads 31 since the ground pads 31 are exposed form the uppermost insulating layer 11 so that there is a direct physical contact between the electrically conductive plastic housing composition 3 and the ground pads 31. The chip contact areas 15 and the upper side 9 of the semiconductor chip 10 are electrically insulated from the plastic housing composition 3 by the uppermost electrically insulating layer 11 of the internal rewiring structure 4 as in the embodiment of FIG. 1.

The semiconductor device 30 may be mounted on a circuit board (not illustrated), for example a printed circuit board, such that the external contacts 33 are mounted on a ground plane of the circuit board. The plastic housing composition 3, the ground pads 31 and external contacts 33 provide electromagnetic shielding as well as the grounding for the rear side 36 of the semiconductor chip 10.

The plastic housing composition 3 can provide protection for the semiconductor chip 10 against external electromagnetic radiation. Furthermore, the plastic housing composition 3 can prevent the emission of electromagnetic radiation from the semiconductor chip 10 which may undesirably influence the functionality of devices mounted on a printed circuit board neighboring the semiconductor device. This may be the case for semiconductor devices in which there are large changes in current per unit time (e.g., switches in half bridge or full bridge circuits).

Figure 6:
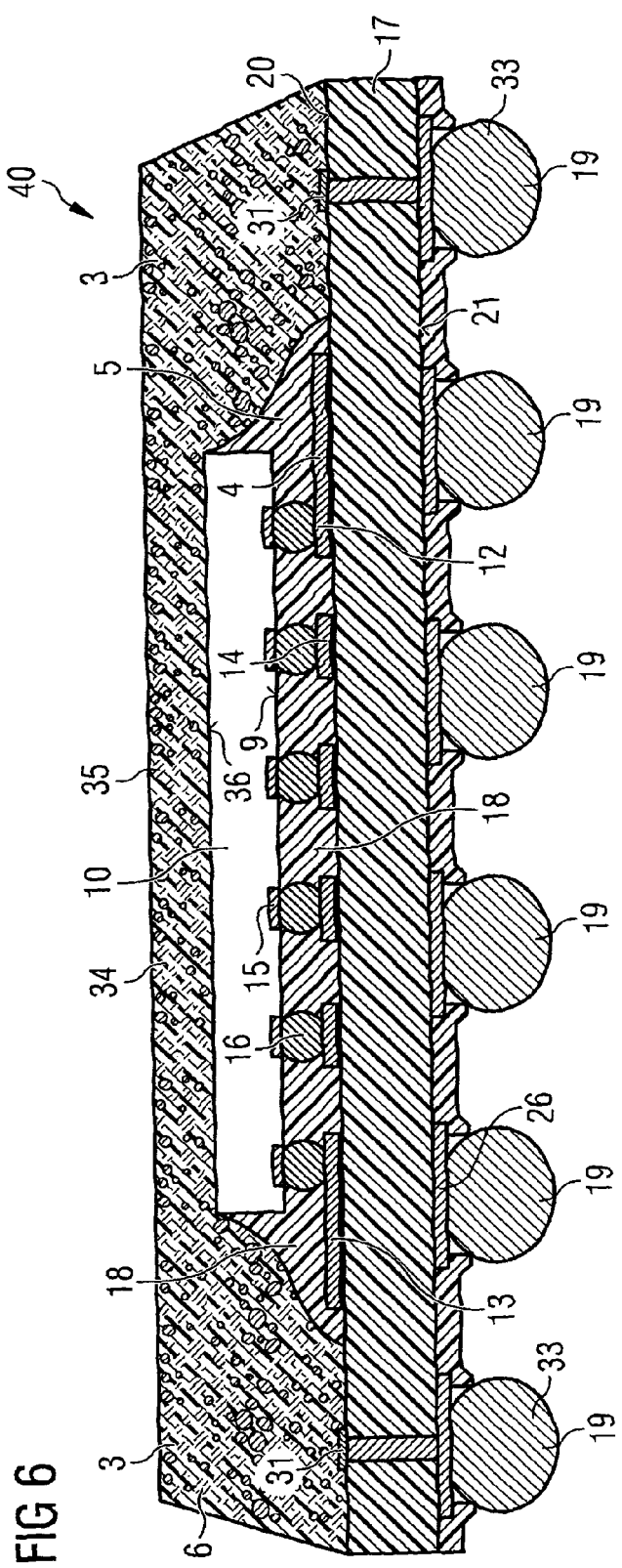
FIG. 6 illustrates a cross-section cross section through a semiconductor device in accordance with a fourth embodiment.

FIG. 6 illustrates a semiconductor device 40 according to a fourth embodiment. The semiconductor device 40 comprises a semiconductor chip 10 with flip-chip contacts 16 and wiring substrate 17 as in the second embodiment of FIG. 4. The semiconductor device 40 also comprises an electrically conductive plastic housing composition 3, as described in connection with the embodiment of FIG. 5.

The wiring substrate 17 comprises ground contact pads 31 which are positioned on the upper side of the wiring substrate 17 and adjacent the side faces 32 of the semiconductor chip 10. The ground pads 31 are also positioned adjacent the rewiring structure 4 which electrically connects the semiconductor chip 10 to the external contact areas 26 positioned on the lower side 21 of the rewiring substrate 17. The ground pads 31 are in physical and electrical contact with the plastic housing composition 3. The grounding pads 31 are electrically connected to external contact areas 26 and external contacts 33 positioned on the lower surface 21 of the rewiring substrate 17. The active side 9, flip-chip contacts 16 and internal wiring 4 which extends between the flip-chip contacts 16 and the wiring substrate 17 are electrically insulated from the plastic housing composition 3 by the insulating layer 5 in the form of underfill material 18 as in the second embodiment of FIG. 4.

Electromagnetic shielding is provided by the electrically conductive plastic housing composition 3, ground pads 31 and external contacts 33 as in the embodiment of FIG. 5. The external contacts 33 may also be electrically connected to a ground plane of a circuit board on which it is mounted as in the previous embodiment.

FIG. 7 illustrates a semiconductor device 50 according to a fifth embodiment. The semiconductor device 50 comprises a vertical semiconductor chip 51 which is illustrated in the embodiment of FIG. 7 as, for example, a vertical power transistor (e.g., a MOSFET device). The vertical semiconductor chip may also be an IGBT or a BJT. The first side 9 of the MOSFET device 51 comprises a source pad 52 which covers the majority of the first side 9 and a laterally smaller gate pad 53 which is electrically insulated from the source pad 52. The opposing second side 54 of the MOSFET device 51 comprises a drain pad 55 which extends over substantially the whole of the second side 54.

The first side 9 of the MOSFET device 51 is positioned on the upper side 20 of an uppermost insulating layer 11 of a rewiring structure produced using the universal package concept as illustrated in FIGS. 1 and 5, for example. The uppermost insulating layer 11, first side 9 and upper side 8 of the plastic housing 3 form a coplanar area 7 as previously described.

The uppermost electrically insulating layer 11 surrounds but, leaves freely accessible, the source pad 52 and gate pad 53 of the MOSFET device 51. The source pad 52 and gate pad 53 are in electrical contact with conductor tracks 12 of the internal wiring 4 positioned underneath the electrically insulating layer 11 and electrically connected via these conductor tracks 12 to second contact areas 26 positioned on the lower side 21 of the rewiring structure 4. More specifically, the source contact pad 52 is electrically connected to external contact block 57 which provides a source contact. In embodiments not illustrated in figures, the source contact 57 may be provided as a large area contact which has an area approximately that of the source pad 52, or is slightly larger than the source contact pad 52. The gate pad 53 is electrically connected to contact block 58 which provides the gate contact of the semiconductor device 50. The gate contact 58 may have a lateral area smaller than the lateral area of the source contact 57 and of the drain contact 56.

The rewiring structure 4 also comprises contact pads 31 positioned in the uppermost electrically insulation layer 11 which extend through the thickness of the electrically insulating layer 11. The uppermost surface 37 of the contact pads 31 is coplanar with the first side 9 of the MOSFET device 51, upper side 8 of the plastic housing composition 3 and upper side 20 of the electrically insulating layer 11.

As in the embodiments of FIGS. 5 and 6, the plastic housing composition 3 comprises an electrically insulating matrix 34 and electrically conductive particles 35 in a proportion such that the plastic housing composition 3 as a whole is electrically conductive. The MOSFET device 51 is embedded in the plastic housing composition 3 so that the plastic housing composition 3 provides an electrical connection between the drain pad 55 positioned on the rear side 54 of the MOSFET device 51 and the contact pads 31 positioned adjacent the side faces 32 of the MOSFET device 51 and a drain contact 56.

The contact pad 31 may be provided in the form of a continuous ring which extends around the side faces 32 of the MOSFET device 51 or may extend on only one side of the MOSFET device 51. In other embodiments, a plurality of contact pads 31 are provided which are electrically connected by portions of the rewiring structure 4 to a single large area external contact 56 which provides the drain contact of the semiconductor device 50.

In the present embodiment, the external contacts 19 of the semiconductor device 50 are provided in the form of contact blocks comprising, for example, copper. The contact blocks 19 may be provided with a solder wettable coating, or a diffusion solder or soft solder coating, which is not illustrated in figures.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit device comprising:
   at least one integrated circuit chip with a first side;
   a rewiring structure comprising an uppermost layer and an internal wiring structure with at least one ground pad; and
   an electrically conductive plastic housing composition at least partially embedding the at least one integrated circuit chip and electrically connected to the at least one ground pad of the internal wiring structure, the plastic housing composition including a plastic matrix and electrically conductive and/or semiconductive filler particles;
   wherein the uppermost layer of the rewiring structure electrically insulates the first side of the integrated circuit chip from the plastic housing composition, and the at least one ground pad of the internal wiring structure extends through the uppermost layer such that the at least one ground pad is in direct physical contact with the electrically conductive plastic housing composition.

2. The integrated circuit device of claim 1, wherein the at least one ground pad comprises a plurality of ground pads distributed adjacent at least one side face of the at least one integrated circuit chip, the plastic housing composition being electrically connected to the plurality of ground pads.

3. The integrated circuit device of claim 1, wherein the integrated circuit chip comprises a plurality of chip contact areas arranged on the first side, the plurality of chip contact areas being electrically insulated from the plastic housing composition by the uppermost layer of the rewiring structure.

4. The integrated circuit device of claim 1, wherein the electrically conductive plastic housing composition is in physical contact with the at least one ground pad.

5. The integrated circuit device of claim 1, wherein the electrically conductive plastic housing composition and the at least one ground pad provide electromagnetic shielding.

6. The integrated circuit device of claim 1, wherein the at least one ground pad is configured to be electrically connected to a ground plane of a circuit board on which the device is to be mounted.

7. The integrated circuit device of claim 1, wherein:
   the rewiring structure further comprises an insulating intermediate layer that carries the internal wiring structure; and
   the internal wiring structure further comprises conductor tracks and second contact pads being electrically connected via the conductor tracks to chip contact areas of the integrated circuit chip in an area including an upper side of the plastic housing composition and the first side of the at least one integrated circuit chip, the uppermost layer of the rewiring substrate electrically insulating the conductor tracks, the second contact pads and the chip contact areas from the electrically conductive plastic housing composition.

8. An integrated circuit device, comprising:
at least one integrated circuit chip including a plurality of contacts disposed on a first side of the chip;
a rewiring substrate comprising an internal wiring structure with at least one ground pad, the at least one integrated circuit chip being arranged on the rewiring substrate;
an electrically conductive plastic housing composition at least partially embedding the at least one integrated circuit chip and electrically connected to the at least one ground pad of the internal wiring structure, the plastic housing composition including a plastic matrix and electrically conductive and/or semiconductive filler particles; and
an insulating layer comprising an electrically insulating underfill material, wherein at least the first side of the integrated circuit chip, the plurality of contacts and the internal wiring structure are embedded in the electrically insulating underfill material and are electrically insulated from the electrically conductive plastic housing composition, and the at least one ground pad of the internal wiring structure extends through a portion of the rewiring substrate such that the at least one ground pad is in direct physical contact with the electrically conductive plastic housing composition.

9. The integrated circuit device of claim 8, wherein the plurality of contacts comprise flip-chip contacts.

10. The integrated circuit device of claim 8, wherein the at least one ground pad comprises a plurality of ground pads distributed adjacent at least one side face of the at least one integrated circuit chip, the plastic housing composition being electrically connected to the plurality of ground pads.

11. The integrated circuit device of claim 8, wherein the electrically conductive plastic housing composition is in physical contact with the at least one ground pad.

12. The integrated circuit device of claim 8, wherein the electrically conductive plastic housing composition and the at least one ground pad provide electromagnetic shielding.

13. The integrated circuit device of claim 8, wherein the at least one ground pad is configured to be electrically connected to a ground plane of a circuit board on which the device is to be mounted.

14. An integrated circuit device comprising:
at least one vertical integrated circuit chip including a first load contact area and a control contact area disposed on a first side of the integrated circuit chip and a second load contact area disposed on a second side of the integrated circuit chip;
a rewiring structure comprising an internal wiring structure with at least one contact pad;
an electrically conductive plastic housing composition at least partially embedding the at least one integrated circuit chip and electrically connected to the at least one first contact pad of the internal wiring structure, the plastic housing composition including a plastic matrix and electrically conductive filler particles; and
an insulation layer electrically insulating the first side of the integrated circuit chip from the plastic housing composition;
wherein the at least one ground pad of the internal wiring structure extends through a portion of the rewiring structure such that the at least one ground pad is in direct physical contact with the electrically conductive plastic housing composition.

15. The integrated circuit device of claim 14, wherein the second load contact area is electrically connected to the at least one contact pad of the internal wiring structure by the electrically conductive plastic housing composition, the first load contact area and the control contact area being electrically insulated from the plastic housing composition by the insulation layer.

16. The integrated circuit device of claim 14, wherein the insulation layer is an uppermost layer of the rewiring structure, the at least one first contact pad extending through the uppermost layer.

17. The integrated circuit device of claim 16, further comprising:
outer contacts;
wherein the internal wiring structure further comprises conductor tracks and second contact pads, the outer contacts being arranged on the second contact pads.

18. The integrated circuit device of claim 14, wherein the at least one contact pad comprises a plurality of contact pads distributed adjacent at least one side face of the at least one integrated circuit chip, the plastic housing composition being electrically connected to the plurality of contact pads.

19. The integrated circuit device of claim 14, wherein the electrically conductive plastic housing composition is in physical contact with the at least one contact pad.

* * * * *